United States Patent
Takahashi et al.

[11] Patent Number: 5,453,692
[45] Date of Patent: Sep. 26, 1995

[54] RF PROBE FOR NUCLEAR MAGNETIC RESONANCE IMAGING (MRI) DEVICES

[75] Inventors: Tetsuhiko Takahashi, Soka; Yoshikuni Matsunaga, Kashiwa; Etsuji Yamamoto, Akishima; Hiroyuki Itagaki, Kokubunji, all of Japan

[73] Assignees: Hitachi, Ltd.; Hitachi Medical Corporation, both of Tokyo, Japan

[21] Appl. No.: 98,816

[22] Filed: Jul. 29, 1993

[30] Foreign Application Priority Data

Aug. 6, 1992 [JP] Japan .................................. 4-210066
Aug. 6, 1992 [JP] Japan .................................. 4-210071

[51] Int. Cl.6 ................................................... G01V 3/00
[52] U.S. Cl. ........................................... 324/318; 324/322
[58] Field of Search .................................. 324/318, 319, 324/320, 322; 128/653.5

[56] References Cited

U.S. PATENT DOCUMENTS

| | | | |
|---|---|---|---|
| 4,641,097 | 2/1987 | Bottomley et al. | 324/318 |
| 4,799,016 | 1/1989 | Rezvani | 324/322 |
| 4,943,775 | 7/1990 | Boskamp et al. | 324/322 |
| 5,017,872 | 5/1991 | Foo et al. | 324/322 |
| 5,049,821 | 9/1991 | Duensing et al. | 324/318 |
| 5,198,768 | 3/1993 | Keren | 324/322 |

FOREIGN PATENT DOCUMENTS

| | | |
|---|---|---|
| 0361190A1 | 4/1990 | European Pat. Off. . |
| 0409292A2 | 1/1991 | European Pat. Off. . |
| 0412824A1 | 2/1991 | European Pat. Off. . |
| 0430104A2 | 6/1991 | European Pat. Off. . |
| 3522401A1 | 1/1987 | Germany . |

*Primary Examiner*—Louis Arana
*Attorney, Agent, or Firm*—Antonelli, Terry, Stout & Kraus

[57] ABSTRACT

An RF probe for an MRI device including a plurality of hollow cylindrical resonators arranged in series such that the respective axes of the resonators align substantially in a z-axis direction of a three dimensional orthogonal coordinate system, radio frequency power signal supply/reception pickup coils to/from the respective resonators; and loop coils situated riding on two adjacent resonators in x- and y-axis directions, and an electromagnetic shield which surrounds the hollow cylindrical resonators, pickup coils and loop coils and grounded with respect to radio frequency.

22 Claims, 6 Drawing Sheets

COORDINATE SYSTEM

1

RF PROBE FOR NUCLEAR MAGNETIC RESONANCE IMAGING (MRI) DEVICES

BACKGROUND OF THE INVENTION

The present invention relates to an RF probe for nuclear magnetic resonance imaging (MRI) devices.

Recently, an echo-planar method which provides superhigh speed image pickup has been studied in many makers and laboratories. A strong gradient magnetic field is required for achieving this method, so that a gradient magnetic field coil used in regular image pickup is not usable for achieving that method. Thus, a method has been proposed in which a strong small gradient magnetic field coil is set separately within a regular gradient magnetic field coil only when superhigh speed image pickup is made. An RF probe used only for superhigh speed image pickup is used further within the small gradient magnetic field in the MRI device of such construction.

RF probe used generally widely is a saddle coil, slotted tube resonator (STR), and a multiple element resonator (MER) which is also called birdcage resonator. QD (Quadrature Detection) method has widely been used to improve the sensitivity of reception and transmission efficiency of such coil. In this method, two orthogonal linear magnetic fields are generated whose phases are 90 degrees out of phase with each other such that a synthetic rotational magnetic field is generated or two received orthogonal linear magnetic fields are caused to deviate by 90 degrees out of phase with each other and then synthesized to detect a radio frequency rotational magnetic field with high sensitivity. Since reception and transmission are in electrically and electromagnetically reversible relationship, reception or transmission will be described below as required.

According to QD method, if the intensities of signals from two orthogonal coils are equal to each other, sensitivity is ideally improved by 1.4 times compared to single linear magnetic field detection. Another means for improving the detection sensitivity is a multiple coil technique, which is also called a phased array technique, used for surface coils. This is a technique where many relatively small-type surface coils which are of high sensitivity are situated on a subject to be detected to thereby increase a field of view while maintaining high sensitivity. In this case, it is required to sophisticatedly eliminate magnetic coupling and hence interference between the coils to prevent a decrease in the detection sensitivity which would otherwise occur due to such interference. Several such methods have been proposed. The QD method is disclosed, for example, in JP-A-4-17837. The MER is disclosed, for example, in U.S. Pat. No. 4,825,163, JP-A-60-132547 and -61-95234. The multiple coils as surface ones are disclosed, for example, in Publication of the translation of Internal Patent Application No. 1990/500,175, JP-B-2-13432, and JP-A-3-68342.

An RF probe with an RF shield is disclosed, for example, JP-A-58-39939. An example of an RF probe used with a small gradient magnetic field is disclosed in *Radiology*, vol. 181, pp.393–397.

Conventionally, the performance of those RF probes has not necessarily been optimized and they are not necessarily suitable for application to clinical diagnosis because their performance is not good and they are inconvenient to use.

SUMMARY OF THE INVENTION

It is an object of the present invention to provide a technique for eliminating interference between the coils to thereby improve the sensitivity of a hollow cylindrical resonator furthermore.

It is another object of the present invention to prevent a deterioration in the image in the use of a plurality of general probes or double-tuning probes for superhigh speed image pickup and for brain function measurement, and to improve the convenience of use of such probes.

In order to achieve the above objects, in the present invention, a plurality of resonators is arranged axially thereof such that the respective axes of the resonators align substantially, for example, in the z-axis direction of a three-dimensional orthogonal axes. A set of decoupling devices is provided which eliminates coupling between x- and y-axis direction radio frequency orthogonal magneto-electric field components in a plane orthogonal to the z axis. The decoupling devices are separately adjustable magnetic flux compensation coils with their axes being orthogonal.

The plurality of resonators is arranged axially thereof such that the respective axes of the resonators align substantially and that the adjacent resonators are different in diameter and overlap.

When the RF coil includes a first coil with a wider magnetic field generation region and a second coil with a narrower magnetic field generation region, an electro-magnetic shield which provides a grounding potential for radio frequencies is provided between the first and second coils. In this case, the second coil is in a floating state with respect to radio frequency.

Such construction eliminates magnetic mutual interference between the hollow cylindrical resonators completely and safely even in a rotational magnetic field. Coupling between the plurality of concentrically situated RF coils is eliminated to thereby improve the sensitivities of RF probes, for example, for superhigh speed image pickup and for brain function measurement.

DESCRIPTION OF THE PREFERRED EMBODIMENTS

Figure 1:
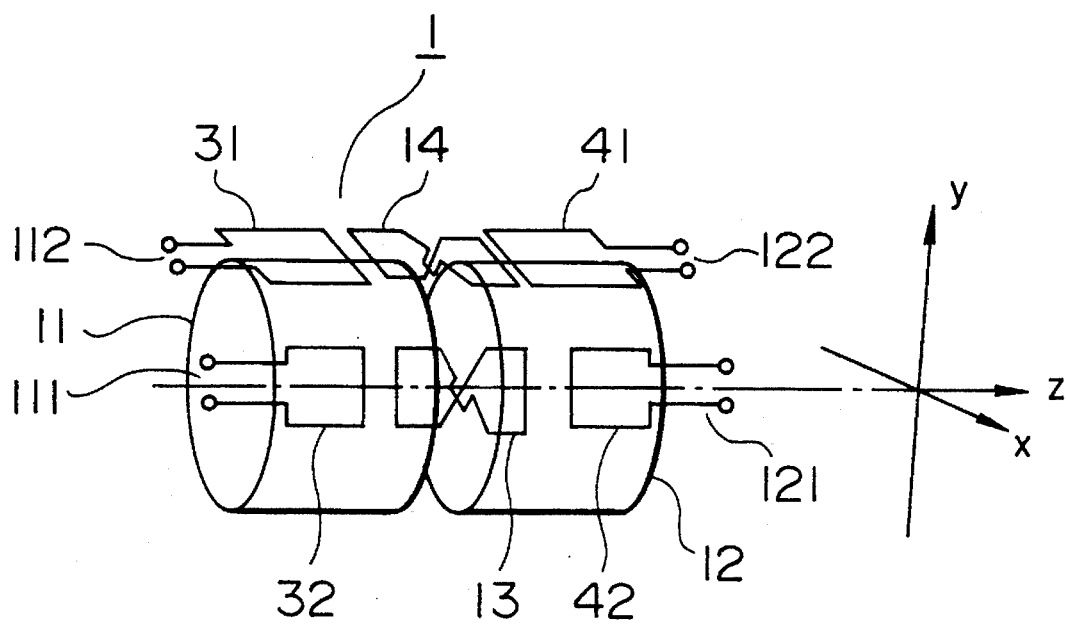
FIG. 1 shows one embodiment of an RF probe according to the present invention.

The present invention will be described below with respect to an embodiment of FIG. 1 which is a perspective view of a preferred RF probe 1. This probe includes a pair of resonators 11 and 12 having the same shape while a conventional RF probe uses only a single resonator. The resonators 11 and 12 are each, for example, a MER which, as shown in FIG. 2, includes a pair of spaced conductive loops 51, 52 sharing a common axis, a plurality of axial conductive segments (rungs) 53 which interconnects the loops electrically and a plurality of capacitors 54 situated in each loop or segment. The MER of the present embodiment is of a high pass type where a plurality of capacitors 54 is situated in the respective loops.

Radio frequency power signal supply/reception to/from the resonator 11 is made in a QD system by inductive coupling through pickup coils 31, 32. In the x axis direction, radio frequency power signal supply/reception is made to/from a port 111 while in the y axis direction, radio frequency power signal supply/reception is made to/from a port 112.

Radio frequency power signal supply/reception is made to/from the resonator 12 is also made in a QD system by inductive coupling through pickup coils 41, 42. In the x axis direction, radio frequency power signal supply/reception is made to/from a port 121 while in the y axis direction, radio frequency power signal supply/reception is made to/from a port 122. A loop compensation coil 13 which compensates for interference by a magnetic field in the x axis direction is provided in a plane perpendicular to the x-axis direction magnetic field. A loop compensation coil 14 which compensates for interference by a magnetic field in the y direction is provided in a plane perpendicular to the y-axis direction magnetic field. The compensating coils 13 and 14 each take the form of "8" and are situated so as to ride on the resonators 11 and 12 close to the inner or outer surface of the hollow cylindrical probe. Capacitors may be provided in circuit of each of the coils 13 and 14 as required so as not to be a load on the gradient magnetic field. The capacity of these capacitors is selected to a value (for example, 1000 pF) which provides a sufficiently low impedance to a radio frequency (64 MHz at 1.5 T) which is a magnetic resonance frequency and which provides a sufficiently high impedance to a low frequency which is the main component of the gradient magnetic field.

Figure 3:
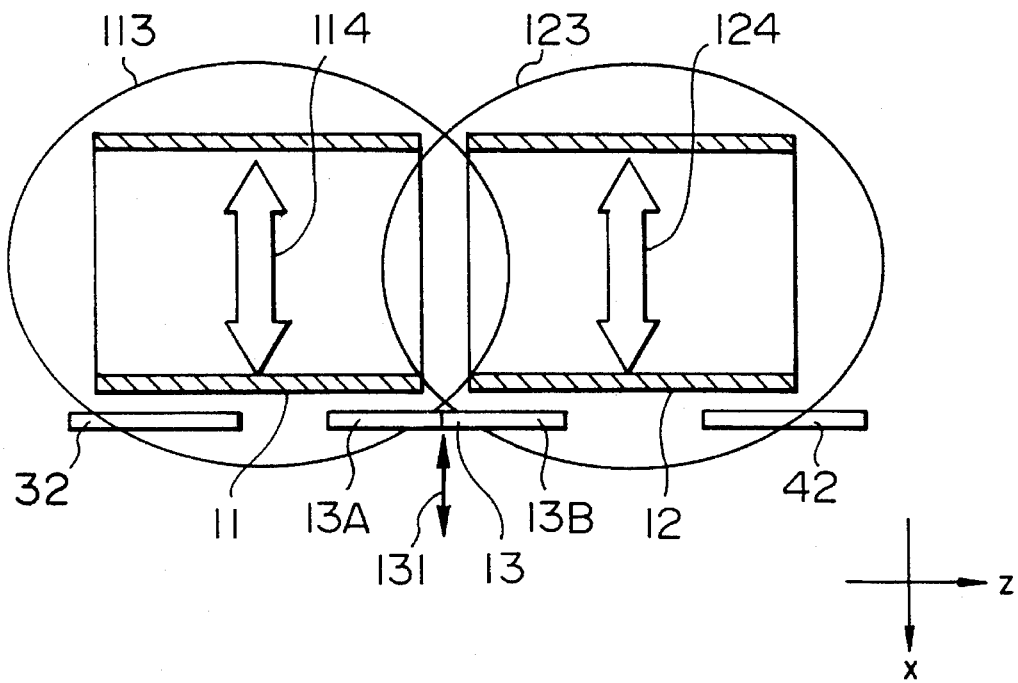
FIG. 3 illustrates generation of a magnetic field in a plane where y=0 in the RF probe of FIG. 1.

The operation of the RF probes will be described below with reference to FIGS. 3 and 4. FIG. 3 shows generation of a magnetic field from the RF probe in a x-z plane where y=0. The x-axis direction magnetic field will be described with reference to FIG. 3. The resonator 11 generates an x-axis direction radio frequency magnetic field 114 in a region 113. At this time, a sensitivity region 123 of the resonator 12 where the resonator 12 is capable of sensing the magnetic field overlaps with the region 113 of a magnetic field 114 generated by the resonator 11, so that without the coil 13 an induction current occurs in the resonator 12 and hence a signal is generated at a port 121 of FIG. 1. Thus, interference occurs between the resonators 11 and 12.

The compensation coil 13 is situated close to the outer periphery of the resonators 11 and 12 and its cross section overlaps with each of the regions in the respective resonators where the magnetic fields are generated (sensitivity regions), so that the coil 13 is magnetically coupled with the resonators 11 and 12. As 1 mentioned above, the coil 13 takes the form of "8" which includes a first loop portion 13A and a second loop portion 13B, so that part of a magnetic flux 114 is inverted and the resulting flux is transmitted to the resonator 12. Thus, the induction current is canceled. The degree of this compensation is determined depending on the respective magnetic fluxes generated by the resonators and traversing the compensation coil. Thus, optimal decoupling is achieved by finely adjusting the distances between the respective resonators 11, 12 and the coil 13 in the direction of arrow in FIG. 3 such that the interference between the resonators is minimized.

When the resonator 12 transmits a radio frequency signal, the signal induced in the resonator 11 is similarly compensated on the basis of the principle of reversibleness of an event.

Figure 2:
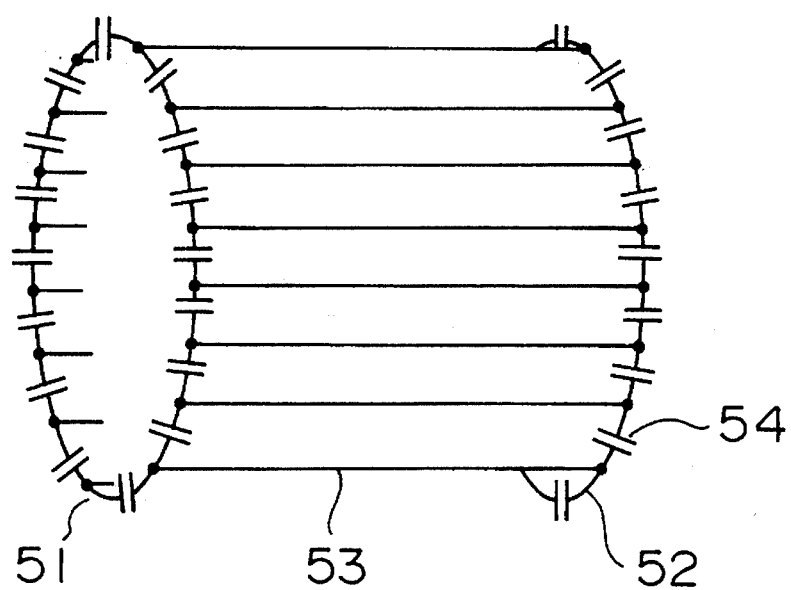
FIG. 2 schematically shows a conventional resonator.
Figure 4:
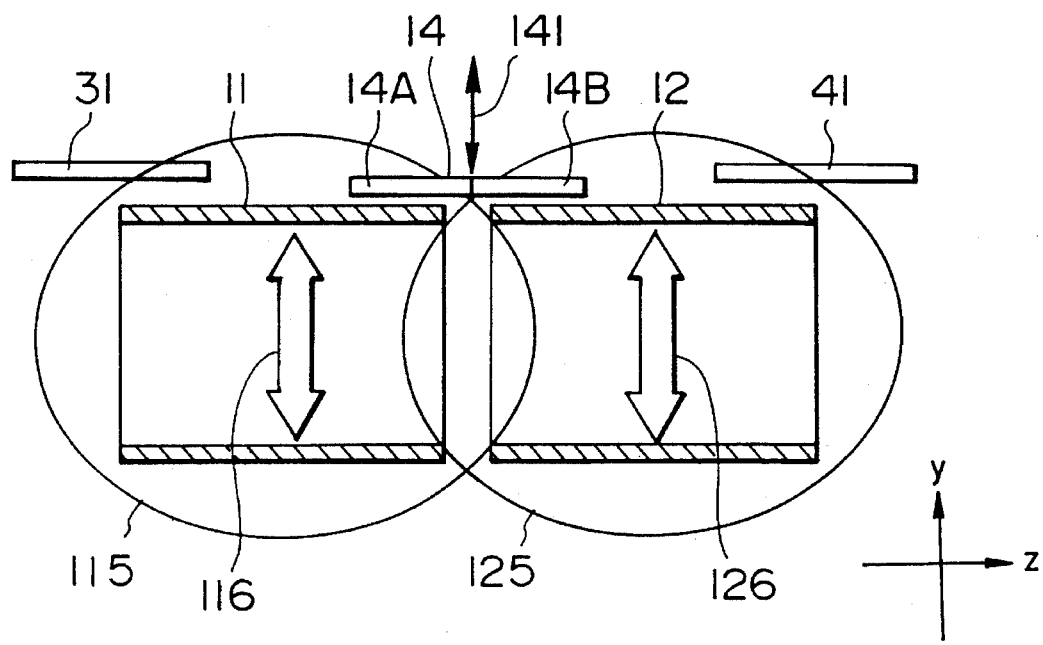
FIG. 4 illustrates generation of a magnetic field in a plane where x=0 in the RF probe of FIG. 1.

FIG. 4 shows generation of a magnetic field in a y-z plane where x=0 in the RF probe of FIG. 1.

The magnetic field in the y-axis direction will be similarly described with reference to FIG. 4. The resonator 11 generates a radio frequency magnetic field 116 in the y-axis direction in a region 115. At this time, the region 115 of the radio frequency magnetic field 116 generated by the resonator 11 overlaps with the sensitivity region 125 of the resonator 12. Thus, without the compensation coil 14, an induction current would be generated in the resonator 12 and a signal would be generated at the port 122 of FIG. 1.

Thus, interference occurs between the resonators 11 and 12. It is eliminated in a manner similar to that mentioned above by the compensation coil 14 (coils 14A, 14B correspond to the coils 13A, 13B of FIG. 3) provided in a plane perpendicular to the magnetic field in the y-axis direction. Those magnetic fields in the x and y axis directions can be finely adjusted independently on the basis of the orthogonality of those magnetic fields. It is obvious that when the resonator 12 transmits a radio frequency signal, a signal induced in the resonator 11 is similarly compensated on the basis of the principles of reversibility of an event. Thus, it will be seen that since there is no interference between the resonators 11 and 12, these resonators can each make a reception with high sensitivity.

A specified shape of the resonators 11 and 12 will be described below. For example, a head image pickup probe has a diameter of 300 mm and a length of 200 mm and is made of 16 elements. The resonators are made, for example, of a copper pipe having a diameter of 3 mm. Each capacitor in each of the loops has a capacitance of about 40–100 PF. The power supply system is of an inductive coupling type which uses a pickup coil. The resonance frequency of the resonators 11 and 12 can be finely adjusted to the desired MRI frequency, for example, of 63.8 MHz at 1.5 T for any of the ports. Magnetic coupling between the pickup coils and the corresponding resonator bodies can be adjusted by changing their relative position to provide a desired impedance value, for example, 50 ohms. The compensating coils 13, 14 may be made, for example, of a copper pipe having a diameter of 3 mm. The compensation coils may each have means for control of its induction current such as a variable resistor or a trapping circuit (not shown).

Figure 5:
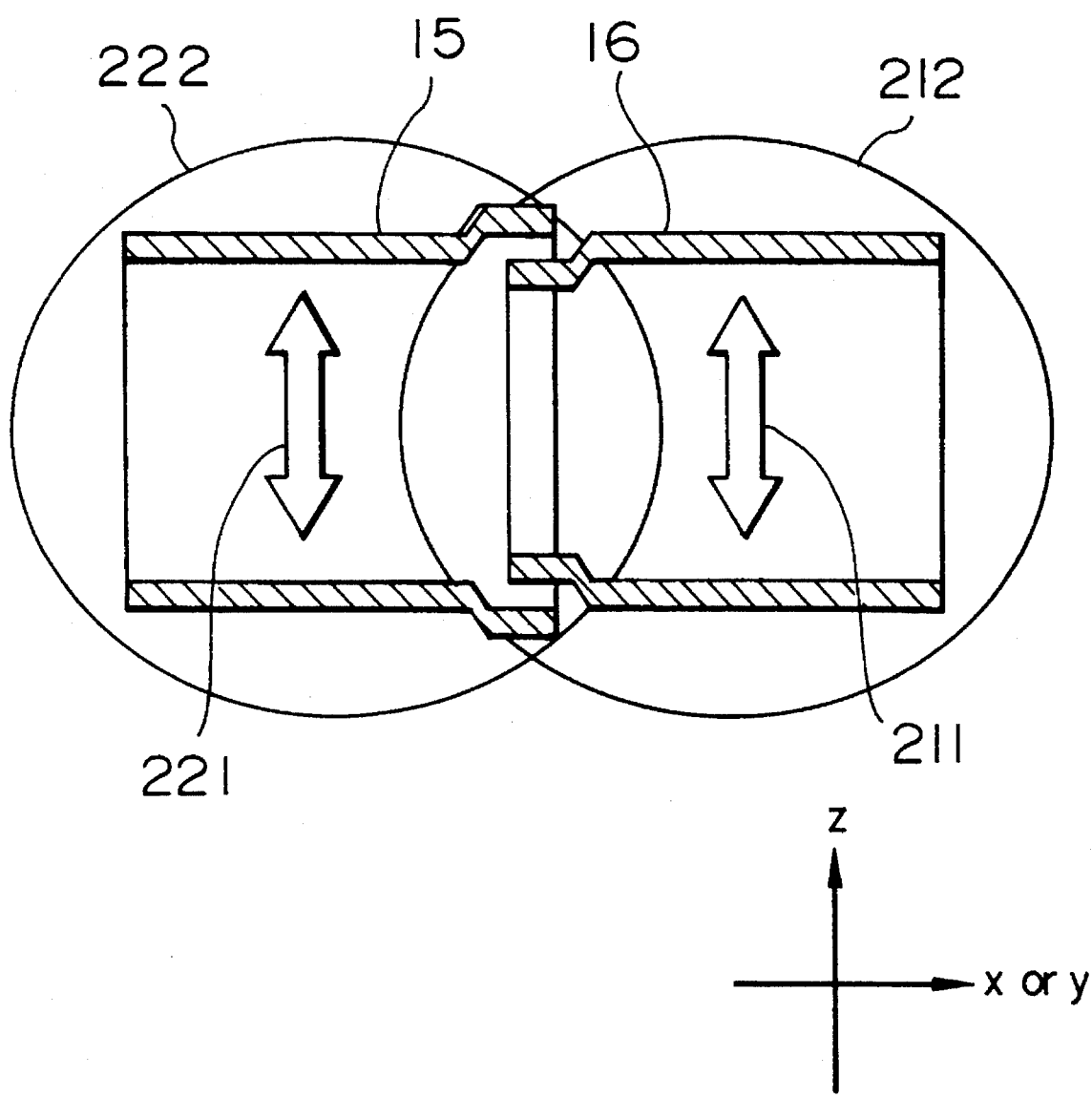
FIG. 5 shows another embodiment of the inventive RF probe.

FIG. 5 shows another embodiment of the inventive RF probe, in which coupling between the magnetic fields of the resonators in the x- or y-axis directions (211, 221 or 211, 221) is eliminated by overlap of the adjacent ends of the resonators 15, 16. Thus, no compensation coils are required. In this case, it is desirable to minimize capacitative coupling between the resonators 15 and 16. This structure provides substantially zero magnetic coupling between the resonators to thereby minimize interference in the resonators although their sensitivity regions 212 and 222 overlap.

Radio frequency power signal supply/reception to/from the resonators 15 and 16 is made through pickup coils (not shown).

Another embodiment may have a decoupling mechanism composed of a feedback circuit which includes a plurality of capacitors, for example, as disclosed in JP-A-3-68342.

These structures are applicable to an overall body probe or a local body probe such as knee probe and neck probe.

While the above description has been made of the operation of the RF probe in the case of the static magnetic field in the z-axis direction, the present invention is also effective in the elimination of interference of a radio frequency electro-magnetic wave in the case of a static magnetic field in a different direction. The present invention is also applicable to various probes of a vertical magnetic field type. The transmission and reception system to/from the resonators is not necessarily limited to the QD type. Radio frequency power signal supply/reception to/from the resonators may not be of the inductive coupling type, but of a capacitive coupling type which uses no pickup coil and which is provided directly in the radio frequency power signal terminal or the resonator body.

Figure 6:
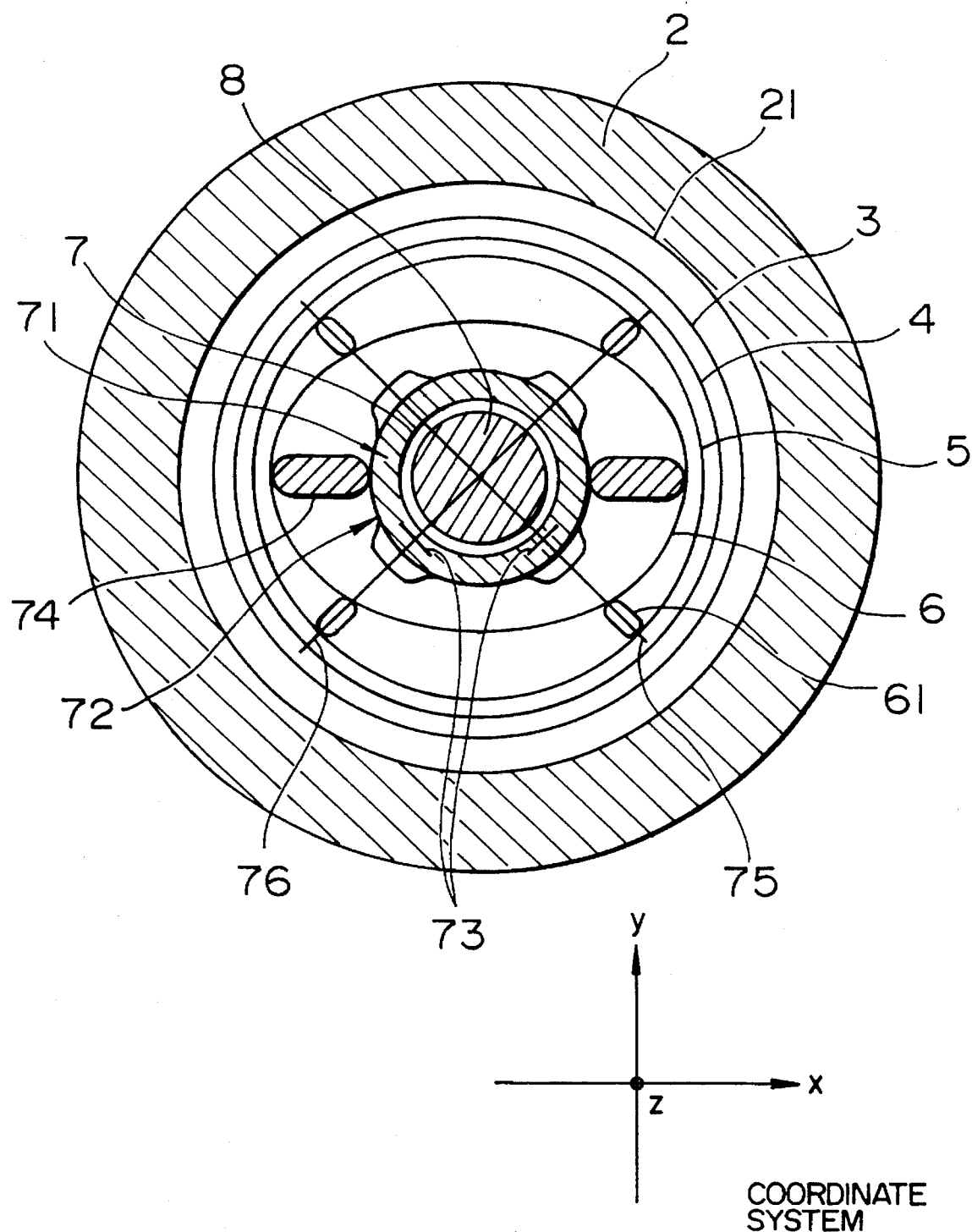
FIG. 6 shows still another embodiment of the inventive RF probe.

FIG. 6 shows another embodiment of the inventive RF probe and also is a schematic cross-sectional view of a magnetic field generator of the MRI device. A static magnetic field magnet 2 is a superconducting magnet which generates a magnetic field having a strength of 1.5 T in the z-axis direction. Provided in a bore 21 in the magnet is a first gradient magnetic field coil 3 which generates a gradient magnetic field having a strength of 10 mT/m in the x-, y- and z-axis directions of a three-dimensional orthogonal coordinate system.

A hollow cylindrical copper electro-magnetic shield 4 is provided inside the gradient magnetic field coil so as to allow a low frequency electro-magnetic wave to pass through the shield from the inside of the shield toward its outside and vice versa, but not to allow a radio frequency electro-magnetic wave to pass therethrough.

Fixed within the shield 4 is a first hollow cylindrical RF coil 5 used for transmission/reception and closed/opened electrically by a decoupling switch (not shown) as required. When the image of a subject 8 is picked up in a regular manner, the gradient magnetic field coil 3 and the RF coil 5 are used.

Since a strong gradient magnetic field is required for superhigh speed image pickup, a second gradient magnetic field coil 6 of FIG. 6 is provided within the overall body RF coil 5 such that the coil 6 is fixed removably by supports 61 to the wall of the bore 21 or the first RF coil 5. The gradient magnetic field coil 6 takes the form of an elliptical hollow cylinder sized so as to accommodate a human body therein and has a length of about 1 m. Provided within the coil 6 is a second RF coil 7. When the subject 8 is, for example, the head of a human being, the RF coil 7 is a head image pickup coil for transmission/reception. It takes the form of a hollow cylinder having a diameter of 25 cm and a length of 25 cm. The basic structure of the coil 7 is a 16-element MER suitable for STR or inductive coupling power supply. The latter provides a floating state for a radio frequency wave, so that it is less influenced by the ambience than the former and is stable even in a 64-MHz MR frequency. Inductive coupling radio frequency power signal supply/reception is effected by pickup coils 73 in two orthogonal directions in an x-y plane for QD transmission/reception.

A coil casing 71 is made of an insulating material such as an acrylic resin or any other conventional insulating resin. An electro-magnetic shield 72 is bonded to the outer wall of the casing and is made of a copper mesh, a copper punching metal or a porous copper foil. It is grounded through the casing of the MRI device with respect to radio frequency. The basic structure of the shield 72 is a hollow cylinder having a diameter of 30 cm and a length of 30 cm. The shield 72 aligns with the RF coil 7. Since the shield 72 and the RF coil 7 are at the ground level and at the floating level, respectively, static coupling between the coil and the shield is low and the radio frequency characteristic of the coil is stabilized. The presence of the shield 72 prevents the RF coil 7 from interference with the external RF probe 5 and the gradient magnetic field coil 6 and protects the RF coil from the influence of possible noise produced by the coils 5 and 6.

It is generally known that as the diameter of the shield 72 decreases, the sensitivity of the RF coil 7 decreases. The inventors found that the sensitivity of the RF coil 7 decreased greatly when the shield 12 was close to the pickup coil 73. In order to avoid this situation, another shield 72 was used having outward protrusions provided only in the vicinity of the pickup coils 73. More particularly, as shown in FIG. 6, the shield 72 has a four-pole-symmetrical structure with four radially outward protrusions which are spaced at intervals of 90 degrees along the outer periphery of the shield 72, the protrusions being plane-symmetrical with respect to planes 75 and 76 each crosses rectangularly with the respective pickup coils 73, so as to exhibit the same shape each time the shield 72 rotates through 90 degrees. This structure stabilizes the probe characteristic and reduces a decrease in the S/N ratio. As a result, even when the diameter of the shield 72 which is conveniently the diameter of an inscribed circle for the shield 72 is small, the sensitivity of the RF coil 7 is not substantially reduced.

Since in the present embodiment the RF coil 7 is integrally with the electromagnetic shield 72, installability important for clinical diagnosis is improved. The RF coil 7 is removably attached by the supports 74 to the gradient magnetic field coil 6. Preferably, provision of a sliding mechanism which sets the RF coil 6 or the gradient magnetic field coil 5 slidably on a bed (not shown) facilitates the setting of the coil to thereby reduce the time for preparation for the clinical diagnosis and to eliminate the need for movement of the subject, desirably.

Another embodiment of the present invention directed to a magnetic field generation system of a multi-tuning MRI device will be described below with respect to FIG. 7. The embodiment is different from that of FIG. 6 in that it has no coil such as the second magnetic field coil 6 of FIG. 6. The same reference numeral is used to identify the same element throughout FIGS. 7 and 6. The operation and features of the present system will be described. The first RF coil 5 is a proton imaging RF coil which resonates at about 64 MHz. Regular imaging is performed by setting a subject 8 within the RF coil. Phosphorus (P) having a mass number of 31 is imaged by setting a second RF coil 7 which resonates at about 26 MHz. The second RF coil 7 has an electromagnetic shield 72, so that it does not interfere with the external proton imaging RF coil 5, and is not influenced by noise, and the magnetic field of the second RF coil 7 is not disturbed. Desirably, provision of a sliding mechanism in the RF coil 7 which sets the second RF coil 7 such that the coil 7 is slidable on a bed (not shown) with the subject 8 being placed on the bed permits setting of the RF coil 7 without movement of the subject 8 to thereby reduce time for preparation for clinical diagnosis and to eliminate the need for movement of the subject 8.

In the present structure, a double tuning coil as a first or second RF coil may be used which can detect two frequencies with a single probe. For example, the first RF coil 5 may resonate with the nuclear magnetic resonance frequency of phosphorus having a proton and a mass number of 31. The second RF coil 7 may resonate with a nuclear magnetic resonance frequency of carbon (C) having a mass number of 13 and sodium (Na) having a mass number of 23. This provides a convenient practical quadruple tuning probe. A method of doubly tuning the respective coils may be well-known techniques which are studied and reported by various makers and laboratories.

Figure 8:
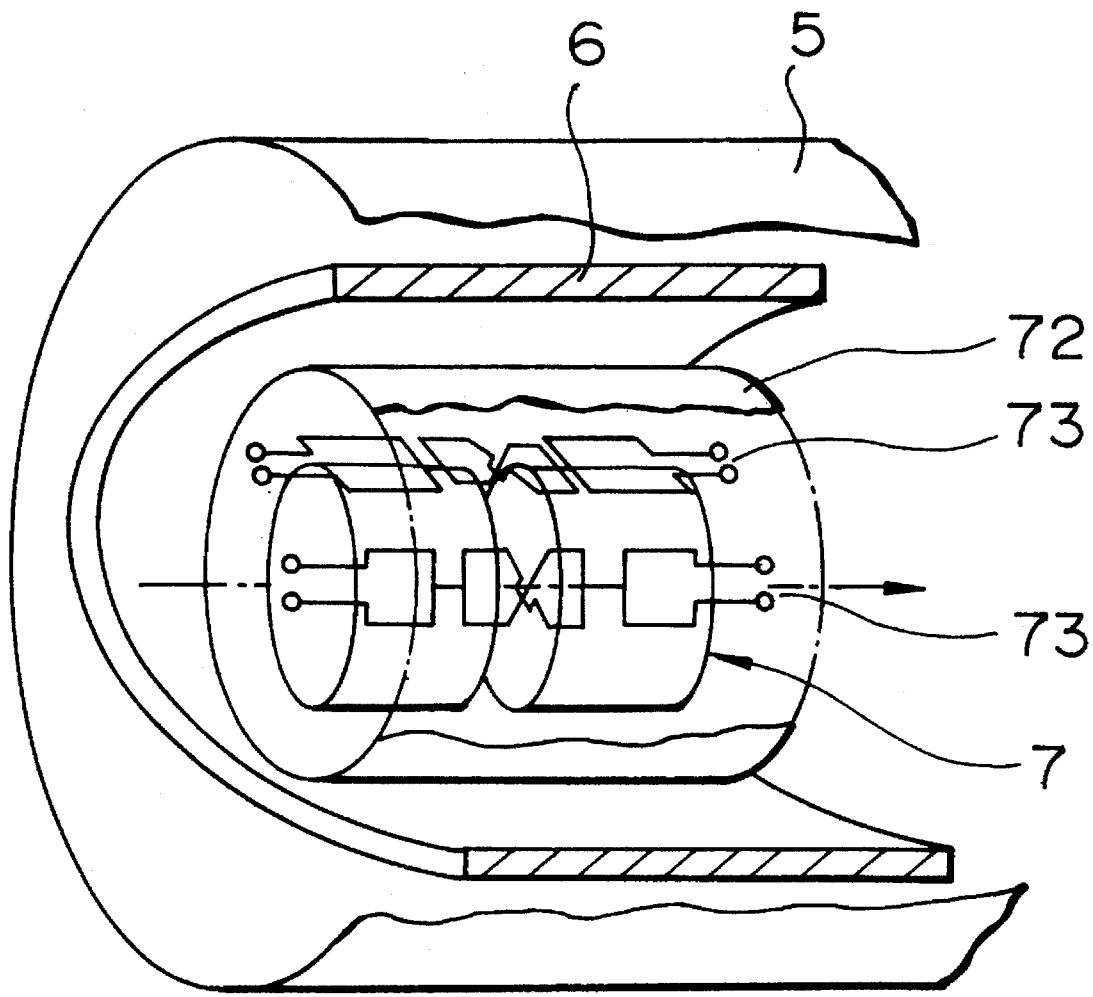
FIG. 8 shows a still further embodiment of the inventive RF probe.

A further embodiment of the present invention is shown in FIG. 8. In the present embodiment, the RF coil 7 of FIG. 6 is replaced with a QD MER including a multiple coil of FIG. 1. In the present embodiment, the sensitivity of the probe is improved by the use of the multiple coil and QD and noise is limited by a radio frequency shield, so that the S/N ratio is further improved.

Figure 7:
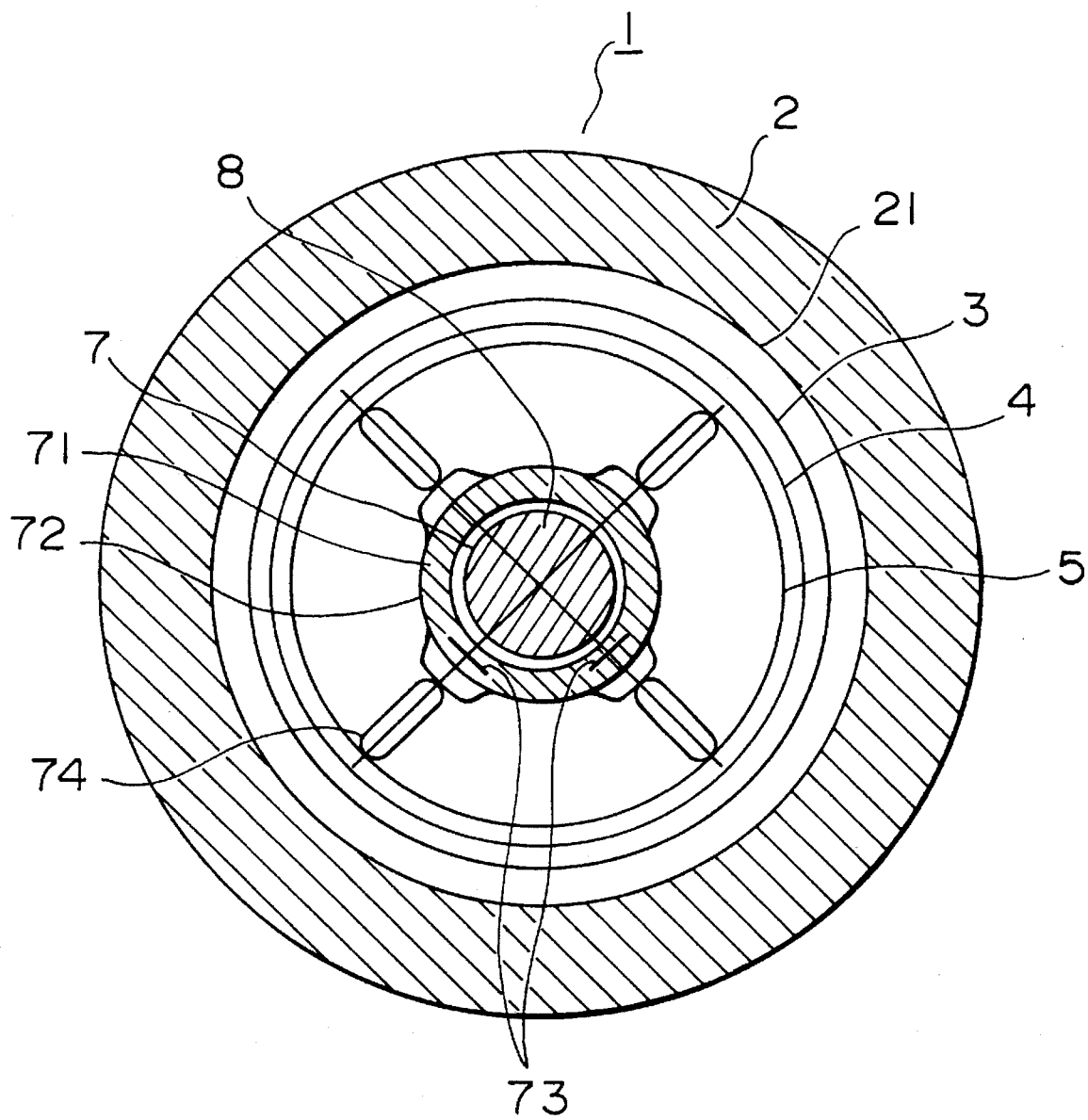
FIG. 7 shows a further embodiment of the inventive RF probe.

The RF coil 7 of FIG. 7 may be replaced with the QD MER of FIG. 1. While the MRI device using a superconducting magnet has been illustrated in the above description, the present invention is applicable to MRI devices using a permanent magnet. While the RF coil has been illustrated as a hollow cylindrical coil, other shapes of coils can also produce advantages similar to those produced by the present invention, as mentioned above. The shapes of the electromagnetic shields are changeable within the scope of the present invention. The gradient magnetic field coil used in the embodiments are only illustrative and may be replaced with a one with another shape and another characteristic.

What is claimed is:

1. An RF probe comprising:

a plurality of hollow cylindrical resonators arranged in an axial direction such that the respective axes of the hollow cylindrical resonators align substantially; and decoupling means comprising a set of loop coils situated in two orthogonal directions so as to ride on two adjacent resonators for eliminating radio frequency coupling between the resonators due to two-direction orthogonal radio frequency magneto-electric fields in a plane normal to the axes, wherein each of said loop coils includes a first loop portion and a second loop portion, said first and second loop portions respectively riding on a different resonator of said two adjacent resonators, and said loop coils being magnetically coupled with said resonators.

2. An RF probe according to claim 1, wherein each of said loop coils takes the form of "8".

3. An Rf probe according to claim 1, wherein each of said resonators comprises a multiple element resonator.

4. An RF probe according to claim 1, wherein each of said resonators comprises a slotted tube resonator.

5. An RF probe comprising:

a plurality of RF coils having different diameters, wherein one of said RF coils includes a plurality of hollow cylindrical resonators arranged in an axial direction such that the respective axes of the hollow cylindrical resonators align substantially;

decoupling means comprising a set of loop coils situated in two orthogonal directions so as to ride on two adjacent resonators for eliminating radio frequency coupling between the resonators due to two-direction orthogonal radio frequency magneto-electric fields in a plane normal to the axes, wherein each of said loop coils includes a first loop portion and a second loop portion, the first and second loop portions respectively riding on a different resonator of the two adjacent resonators, and said loop coils being magnetically coupled with said resonators; and an electro-magnetic shield provided between any two adjacent RF coils and grounded with respect to radio frequency.

6. An RF probe according to claim 5, wherein said plurality of RF coils comprises a first RF coil having a wider magnetic field generation region and a second RF coil having a narrower magnetic field generation region, said shield being provided on a casing of said second RF coil.

7. An RF probe according to claim 6, wherein said second RF coil is in a floating state with respect to radio frequency.

8. An RF probe according to claim 6, wherein said second RF coil comprises a multiple element resonator.

9. An RF probe according to claim 6, wherein said second RF coil comprises a slotted tube resonator.

10. An RF probe according to claim 5, wherein each of said RF coils have a different resonance frequency.

11. An RF probe according to claim 5, wherein said shield has a hollow cylindrical structure.

12. An RF probe according to claim 5, wherein said shield has a non-hollow cylindrical structure having four-pole symmetricalness.

13. An RF probe according to claim 5, wherein each of said loop coils takes the form of 8.

14. A magnetic field generator for an MRI device, comprising:

static magnetic field generating means;

first gradient magnetic field generating means for generating a gradient magnetic field;

a first RF coil, provided within said first gradient magnetic field generating means, for transmitting and receiving a signal having a first nuclear magnetic resonance frequency;

a second RF coil, providing within said first gradient magnetic field generating means, for transmitting and receiving a signal having a second nuclear magnetic resonance frequency, including a plurality of hollow cylindrical resonators arranged in an axial direction such that the respective axes of the hollow cylindrical resonators align substantially;

decoupling means comprising a set of loop coils situated in two orthogonal directions so as to ride on two adjacent resonators for eliminating radio frequency coupling between the resonators due to two-direction orthogonal radio frequency magneto-electric fields in a plane normal to the axes, wherein each of said loop coils includes a first loop portion and a second loop portion, the first and second loop portions respectively riding on a different resonator of the two adjacent resonators, and said loop coils being magnetically coupled with said resonators; and an electro-magnetic shield provided between said first and second RF coils and grounded with respect to radio frequency.

15. A magnetic field generator according to claim 14, further comprising second gradient magnetic field generating means for generating a gradient magnetic field between said first and second RF coils.

16. A magnetic field generator according to claim 14, wherein each of said shield is provided to a casing of said second RF coil.

17. A magnetic field generator according to claim 14, wherein said second RF coil is in a floating state with respect to radio frequency.

18. A magnetic field generator according to claim 14, wherein said second RF coil comprises a multiple element resonator.

19. A magnetic field generator according to claim 14, wherein said second RF coil comprises a slotted tube resonator.

20. A magnetic field generator according to claim 14, wherein said shield has a hollow cylindrical structure.

21. A magnetic field generator according to claim 14, wherein said shield has a non-hollow cylindrical structure having four-pole symmetricalness.

22. A magnetic field generator according to claim 14, wherein said set of loop coils takes the form of "8".

* * * * *